United States Patent
Tsukatani et al.

(10) Patent No.: US 9,472,731 B2
(45) Date of Patent: Oct. 18, 2016

(54) PHOSPHOR-CONTAINING RESIN MOLDED BODY, LIGHT EMITTING DEVICE, AND RESIN PELLET

(71) Applicant: Shin-Etsu Chemical Co., Ltd., Tokyo (JP)

(72) Inventors: Toshihiko Tsukatani, Echizen (JP); Toshihiro Tsumori, Echizen (JP); Kazuhiro Wataya, Echizen (JP); Hajime Nakano, Echizen (JP); Takehisa Minowa, Echizen (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 14/655,518

(22) PCT Filed: Dec. 25, 2013

(86) PCT No.: PCT/JP2013/084630
§ 371 (c)(1),
(2) Date: Jun. 25, 2015

(87) PCT Pub. No.: WO2014/104079
PCT Pub. Date: Jul. 3, 2014

(65) Prior Publication Data
US 2016/0218251 A1    Jul. 28, 2016

(30) Foreign Application Priority Data
Dec. 28, 2012    (JP) .................. 2012-287370

(51) Int. Cl.
*H01L 33/00*    (2010.01)
*H01L 33/50*    (2010.01)
(Continued)

(52) U.S. Cl.
CPC .......... *H01L 33/502* (2013.01); *H01L 33/507* (2013.01); *H01L 33/56* (2013.01); *H01L 33/58* (2013.01); *H01L 2933/0091* (2013.01)

(58) Field of Classification Search
CPC ...... H01L 33/56; H01L 33/58; H01L 33/502; H01L 33/504; H01L 33/507; H01L 2924/00; H01L 2924/3025; H01L 2224/45144; H01L 2224/45015
See application file for complete search history.

(56) References Cited

U.S. PATENT DOCUMENTS

| | | | |
|---|---|---|---|
| 6,180,029 B1 * | 1/2001 | Hampden-Smith ...... | B01J 2/003 252/301.4 R |
| 6,193,908 B1 * | 2/2001 | Hampden-Smith ...... | B01J 2/003 252/301.35 |

(Continued)

FOREIGN PATENT DOCUMENTS

| | | |
|---|---|---|
| CN | 102344284 A | 2/2012 |
| JP | 11043672 A * | 2/1999 |

(Continued)

OTHER PUBLICATIONS

International Search Report dated Feb. 10, 2014, issued in corresponding application No. PCT/JP2013/084630 (2 pages).

(Continued)

*Primary Examiner* — Yosef Gebreyesus
(74) *Attorney, Agent, or Firm* — Westerman, Hattori, Daniels & Adrian, LLP

(57) ABSTRACT

A phosphor-containing resin molded body and a wavelength conversion member, in each of which one or more kinds of spherical phosphors represented by $(A_xB_yC_z)_3C_5O_{12}$ (wherein A represents one or more rare earth elements selected from among Y, Gd and Lu; B represents one or more rare earth elements selected from among Ce, Nd and Tb; C represents Al and/or Ga; and x, y and z respectively represent positive numbers satisfying $0.002 \leq y \leq 0.2$, $0 < z \leq 2/3$ and $x+y+z=1$) and having an average circularity of 0.3 or less are dispersed in an amount of 0.1-20% by mass; a light emitting device which is provided with the wavelength conversion member; and a resin pellet for phosphor-containing resin molded bodies.

16 Claims, 3 Drawing Sheets

(51) Int. Cl.
    *H01L 33/56*    (2010.01)
    *H01L 33/58*    (2010.01)

(56) References Cited

U.S. PATENT DOCUMENTS

| | | | |
|---|---|---|---|
| 6,350,041 | B1 | 2/2002 | Tarsa et al. |
| 6,875,372 | B1 * | 4/2005 | Hampden-Smith ...... B01J 2/003 252/301.4 F |
| 7,267,786 | B2 * | 9/2007 | Fiedler ............... C09K 11/7769 252/301.4 F |
| 8,865,022 | B2 | 10/2014 | Tsukatani et al. |
| 2006/0169998 | A1 | 8/2006 | Radkov et al. |
| 2007/0292631 | A1 | 12/2007 | Shinozaki et al. |
| 2009/0072710 | A1 * | 3/2009 | Schmidt ............. C09K 11/0883 313/503 |
| 2009/0212257 | A1 * | 8/2009 | Sohn ................. B32B 27/08 252/301.36 |
| 2010/0188613 | A1 | 7/2010 | Tsukahara et al. |
| 2011/0272725 | A1 | 11/2011 | Wataya et al. |
| 2011/0294240 | A1 * | 12/2011 | Kim ................... H01L 25/0753 438/16 |
| 2011/0305005 | A1 * | 12/2011 | Tsukatani .......... C09K 11/7774 362/97.3 |
| 2012/0007494 | A1 * | 1/2012 | Sambandan ....... C09K 11/7774 313/503 |
| 2012/0175559 | A1 | 7/2012 | Tsukatani et al. |
| 2012/0256125 | A1 | 10/2012 | Kaneyoshi et al. |

FOREIGN PATENT DOCUMENTS

| | | |
|---|---|---|
| JP | 11-199867 A | 7/1999 |
| JP | H11-199781 A | 7/1999 |
| JP | 2007-016196 A | 1/2007 |
| JP | 2009-173905 A | 8/2009 |
| JP | 2010-171342 A | 8/2010 |
| JP | 2012-17454 A | 1/2012 |
| JP | 2012-153881 A | 8/2012 |
| JP | 2012-153904 A | 8/2012 |
| JP | 2012-224536 A | 11/2012 |
| WO | 2012/081411 A1 | 6/2012 |

OTHER PUBLICATIONS

Japanese Office Action dated Dec. 1, 2015 issued in counterpart Japanese patent application No. 2014-554485. (4 pages).

Office Action dated Apr. 19, 2016, issued in counterpart Chinese Patent Application No. 201380068209.5. (8 pages).

Extended (Supplementary) European Search Report (EESR) dated Aug. 2, 2016, issued in counterpart European Patent Application No. 13869749.5. (8 pages).

Takashi Ogi, et al., "Direct Synthesis of Spherical YAG:Ce Phosphor From Precursor Solution Containing Polymer and Urea", Chemical Engineering Journal, vol. 210, Nov. 1, 2012, pp. 461-466.

* cited by examiner

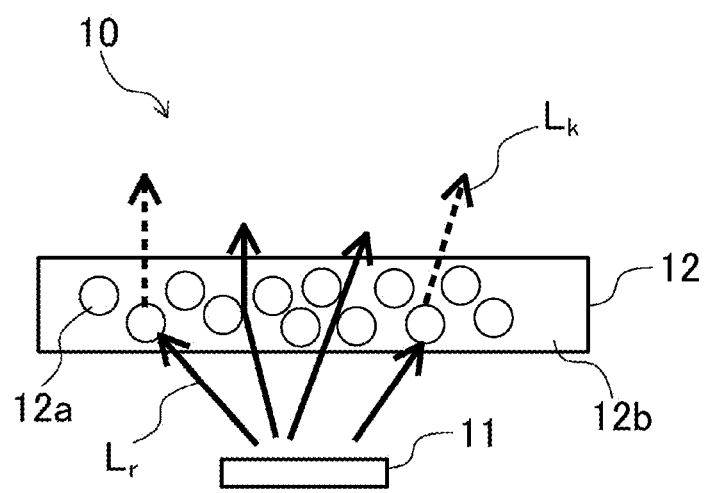
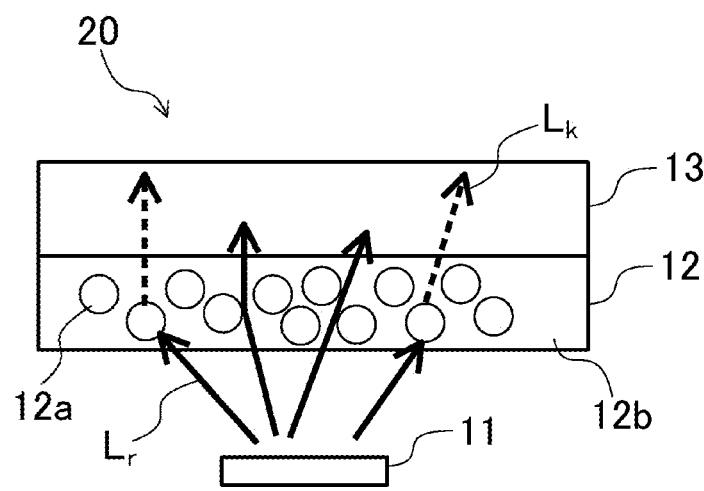

PHOSPHOR-CONTAINING RESIN MOLDED BODY, LIGHT EMITTING DEVICE, AND RESIN PELLET

TECHNICAL FIELD

This invention relates to phosphor-containing resin molded parts which are suitable for use as wavelength conversion members in light-emitting devices using blue light-emitting diodes (LEDs) such as general purpose illuminating devices, backlight sources and headlight sources; a light-emitting device using the wavelength conversion member; and resin pellets for forming phosphor-containing resin molded parts.

BACKGROUND ART

Light-emitting diodes (LEDs) belong to a class of the most efficient light sources among currently available light sources. In particular, white LEDs find a rapidly expanding share in the market as the next-generation light source to replace incandescent lamps, fluorescent lamps, cold cathode fluorescent lamps (CCFL) for backlight, and halogen lamps. As one configuration for white LED, a pseudo-white LED device constructed by combining a blue light-emitting diode with a phosphor capable of emitting light of longer wavelength, for example, yellow or green light upon blue light excitation is implemented on a commercial basis.

Known examples of the yellow phosphor which is combined with the blue LED to produce pseudo-white light include $Y_3Al_5O_{12}$:Ce, $(Y,Gd)_3(Al,Ga)_5O_{12}$:Ce, $(Y,Gd)_3Al_5O_{12}$:Ce, $Tb_3Al_5O_{12}$:Ce, $CaGa_2S_4$:Eu, $(Sr,Ca,Ba)_2SiO_4$:Eu, and Ca-α-SiAlON:Eu.

The mainstream of the white LED structure is a system in which a phosphor is placed on or near a blue LED so that the phosphor may convert the wavelength of part of blue light to produce white light. Also some devices are based on a system in which a phosphor is spaced apart from a blue LED by a distance of several millimeters to several tens of millimeters so that the phosphor may cause wavelength conversion to part of blue light. Particularly when the phosphor tends to degrade its properties by the heat generated by the blue LED, the far distance of phosphor from the blue LED is effective for preventing the phosphor from changing its color tone by the heat generation of the blue LED and suppressing a reduction of luminous intensity. The phosphor-containing wavelength conversion member used in this system is known as "remote phosphor" plate.

The known methods of disposing the phosphor as a wavelength conversion member at a spacing of several millimeters to several tens of millimeters from the blue LED include a method of mixing and dispersing the phosphor in a silicone resin or epoxy resin, and coating the resin to a transparent substrate, and a method of mixing, kneading and dispersing the phosphor in a thermoplastic resin, molding the resin, and placing the molded part at a spacing from the blue LED. Of these, the method of mixing, kneading and dispersing the phosphor in a thermoplastic resin, molding the resin, and placing the molded part as a wavelength conversion member is employed in most cases because of freedom of choice of the strength and arrangement of the resin layer.

Notably, the preceding documents pertinent to the present invention include, for example, U.S. Pat. No. 6,350,041 (Patent Document 1), JP-A 2012-153904 (Patent Document 2), and JP-A 2012-017454 (Patent Document 3).

CITATION LIST

Patent Documents

Patent Document 1: U.S. Pat. No. 6,350,041
Patent Document 2: JP-A 2012-153904
Patent Document 3: JP-A 2012-017454

SUMMARY OF INVENTION

Technical Problem

Since conventional phosphors have a high hardness, an irregular angular shape, and a broad particle size distribution, problems arise in the step of mixing, kneading and dispersing the phosphor in a resin, typically thermoplastic resin, for example, the phosphor causes abrasion to screws, rotary members and cylinders in a mixer or kneader and a powder feeder thereto, after which abraded metal fines are introduced into the resin as impurities, and voids are left at the interface between irregular particles and the resin.

Also, the wavelength conversion member used as the remote phosphor plate in the light-emitting device has the problem that since the conventional phosphor therein contains irregular fines, by which blue light is repeatedly reflected and scattered, it is difficult to control the quantity of light emerging from the wavelength conversion member and the ratio of blue light (excitation light) to different color light (wavelength converted light). Furthermore, when a multilayer remote phosphor plate is formed from wavelength conversion members, it is necessary to adjust the quantity of blue light extracted from a first wavelength conversion member disposed adjacent to the blue LED to a second wavelength conversion member disposed on top of the first member. There is the problem that since the conventional phosphor contains irregular fines, by which blue light is repeatedly reflected and scattered, it is difficult to adjust the quantity of blue light extracted from the first wavelength conversion member.

An object of the invention, which has been made under the above-mentioned circumstances, is to provide a phosphor-containing resin molded part which is suitable for use as a wavelength conversion member or the like because the step of mixing, kneading and dispersing a phosphor in a resin, typically thermoplastic resin is improved such as to suppress the introduction of metal fines into the resin; a light-emitting device comprising a wavelength conversion member capable of readily adjusting the ratio of transmitted light to wavelength converted light; and resin pellets for forming the phosphor-containing resin molded part.

Solution to Problem

Making extensive investigations in order to disperse a phosphor in a resin in a highly productive way, the inventors have found that as long as spherical phosphor particles are used, even if the phosphor has high hardness, a phosphor-containing resin molded part can be prepared while preventing the phosphor from abrading a screw, rotary member or cylinder in a mixer or kneader; and that by using spherical phosphor particles as the phosphor in a phosphor-containing resin molded part serving as a wavelength conversion member, it becomes possible to restrain reflection and scattering of excitation light and wavelength converted light within the wavelength conversion member.

Accordingly, the invention provides a phosphor-containing resin molded part, a light-emitting device, and resin pellets for phosphor-containing resin molded parts, as defined below.

[1] A phosphor-containing resin molded part comprising a resin and a spherical phosphor of at least one type represented by the compositional formula (1):

$$(A_xB_yC_z)_3C_5O_{12} \tag{1}$$

wherein A is at least one rare earth element selected from among Y, Gd and Lu, B is at least one rare earth element selected from among Ce, Nd and Tb, C is Al and/or Ga, and x, y and z are positive numbers satisfying $0.002 \leq y \leq 0.2$, $0 < z \leq 2/3$, and $x+y+z=1$, and having an average roundness of up to 0.3, the phosphor being dispersed in the resin in an amount of 0.1 to 20% by weight.

[2] The molded part of [1] wherein the spherical phosphor has a dispersion index of 0.1 to 0.7.

[3] The molded part of [1] or [2], further comprising 0.01 to 10% by weight of a light scattering agent.

[4] The molded part of any one of [1] to [3] wherein said resin is a thermoplastic resin.

[5] The molded part of any one of [1] to [4], having an Fe content of not more than 10 ppm.

[6] A wavelength conversion member comprising the phosphor-containing resin molded part of any one of [1] to [5].

[7] The wavelength conversion member of [6] wherein in formula (1), A is at least one rare earth element selected from Y and Gd, and the wavelength conversion member has a L* value of at least 60, a b* value of at least 50, and a saturation C* of at least 50 as expressed according to the CIE L*a*b* colorimetric system.

[8] The wavelength conversion member of [6] wherein in formula (1), A is Lu, and the wavelength conversion member has a L* value of at least 60, a b* value of at least 30, and a saturation C* of at least 40 as expressed according to the CIE L*a*b* colorimetric system.

[9] A light-emitting device comprising a blue LED light source having an optical axis and a wavelength conversion member disposed on the optical axis, the wavelength conversion member being of any one of [6] to [8].

[10] The light-emitting device of [9], further comprising another wavelength conversion member comprising a phosphor capable of absorbing blue light and emitting light having a different wavelength than the spherical phosphor.

[11] The light-emitting device of [10] wherein the other wavelength conversion member comprises a red phosphor capable of absorbing blue light and emitting at least red light.

[12] The light-emitting device of any one of [9] to [11], further comprising a diffuse lens disposed outside a luminous body of emitting pseudo-white light.

[13] Resin pellets for forming phosphor-containing resin molded parts, comprising a thermoplastic resin and a spherical phosphor of at least one type represented by the compositional formula (1):

$$(A_xB_yC_z)_3C_5O_{12} \tag{1}$$

wherein A is at least one rare earth element selected from among Y, Gd and Lu, B is at least one rare earth element selected from among Ce, Nd and Tb, C is Al and/or Ga, and x, y and z are positive numbers satisfying $0.002 \leq y \leq 0.2$, $0 < z \leq 2/3$, and $x+y+z=1$, and having an average roundness of up to 0.3, the phosphor being dispersed in the resin in an amount of 0.1 to 20% by weight.

[14] The resin pellets of [13] wherein the spherical phosphor has a dispersion index of 0.1 to 0.7.

[15] The resin pellets of [13] or [14], further comprising 0.01 to 10% by weight of a light scattering agent.

[16] The resin pellets of any one of [13] to [15], having an Fe content of not more than 10 ppm.

Advantageous Effects of Invention

The invention provides phosphor-containing resin molded parts and resin pellets therefor, characterized by a minimal metal impurity content and uniform dispersion of the phosphor, and suited as the remote phosphor plate. The light-emitting device wherein a phosphor-containing resin molded part having spherical phosphor particles with an average roundness of up to 0.3 dispersed therein is used as a wavelength conversion member makes it possible to simply adjust the quantity of light output and the ratio of excitation light to wavelength converted light.

BRIEF DESCRIPTION OF DRAWINGS

FIG. 1 is a schematic cross-sectional view showing one embodiment (1) of a light-emitting device according to the invention.

FIG. 2 is a schematic cross-sectional view showing another embodiment (2) of a light-emitting device according to the invention.

DESCRIPTION OF EMBODIMENTS

Figure 3:
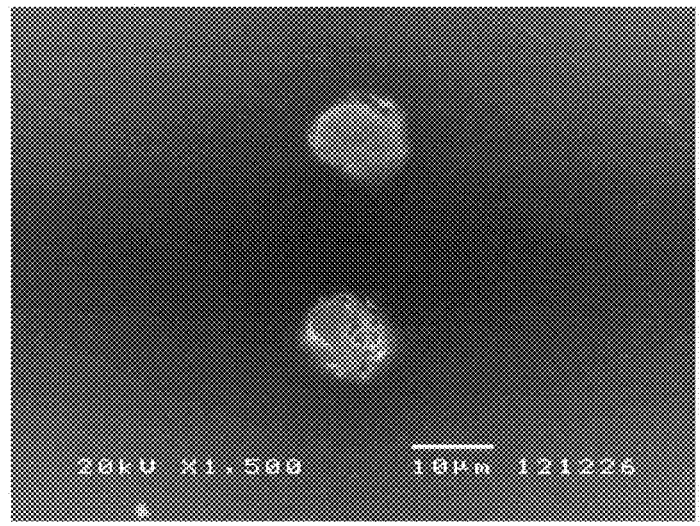
FIG. 3 is a SEM image showing a cross section of the wavelength conversion member in Example 1.

The phosphor-containing resin molded part useful as a wavelength conversion member and resin pellets for forming the phosphor-containing resin molded part according to the invention are described below.

The phosphor-containing resin molded part (wavelength conversion member) and resin pellets therefor according to the invention are defined as comprising a resin and a spherical phosphor of at least one type having an average roundness of up to 0.3, the phosphor being dispersed in the resin in an amount of 0.1 to 20% by weight.

The spherical phosphor is phosphor particles comprising a garnet phase of the compositional formula (1):

$$(A_xB_yC_z)_3C_5O_{12} \tag{1}$$

wherein A is one or more rare earth elements selected from among Y, Gd and Lu, B is one or more rare earth elements selected from among Ce, Nd and Tb, C is Al and/or Ga, and x, y and z are positive numbers satisfying $0.002 \leq y \leq 0.2$, $0 < z \leq 2/3$, and $x+y+z=1$. The ratio (atomic ratio) of elements A, B and C in formula (1) is preferably $C/(A+B) > 5/3$, especially $C/(A+B) \geq 5.02/2.98$, and also preferably $C/(A+B) \leq 6/2$, especially $C/(A+B) \leq 5.6/2.4$.

The phosphor particles comprising such garnet phase may be, for example, those prepared by the method disclosed in JP-A 2012-153904 (Patent Document 2), specifically by furnishing one or more oxides containing elements represented by A, B and C in formula (1) as raw material, mixing one or more powdered oxides such that elements represented by A, B and C may be present in the above-defined ratio (atomic ratio), granulating the mixture to an average particle size of 5 to 65 µm, melting the granules in a plasma, solidifying outside the plasma into spherical particles, and heat treating the resulting particles in a non-oxidizing atmosphere at a temperature of higher than 800° C. to 1,700° C.

The phosphor particles should have an average roundness of equal to or less than 0.3, preferably equal to or less than 0.2, and more preferably equal to or less than 0.1. If phosphor particles having an average roundness in excess of 0.3 are used, some problems may occur. Light (blue light) incident on the phosphor-containing resin molded part (wavelength conversion member) is repeatedly reflected and scattered therein, which inhibits blue light from penetrating through the molded part. In addition, at the stage of manufacturing the phosphor-containing resin molded part and resin pellets therefor, the phosphor particles abrade screws, rotary members and cylinders in a mixer or kneader, after which abraded fines are introduced as metal impurities into the phosphor-containing resin molded part and resin pellets therefor. Voids are often left at the interface between phosphor particles and the resin.

The roundness may be determined from a projection image of a particle as observed under an electron microscope, by measuring the diameters of a circumscribed circle and an inscribed circle with respect to the particle contour. The roundness is determined from the equation:

roundness={(circumscribed circle diameter)−(inscribed circle diameter)}/[{(circumscribed circle diameter)+(inscribed circle diameter)}/2].

The average roundness is an average of roundness values in a group of phosphor particles under test (for instance, an average of n particles wherein n=100).

The spherical phosphor has a dispersion index of preferably 0.1 to 0.7, and more preferably 0.1 to 0.4. If the dispersion index exceeds 0.7, some problems may occur. Light (blue light) incident on the phosphor-containing resin molded part (wavelength conversion member) is repeatedly reflected and scattered therein, which inhibits blue light from penetrating through the molded part. In a hopper for feeding phosphor particles into a side feeder of a kneader, phosphor particles may form bridges which inhibit further supply. Even if phosphor particles are fed to the side feeder, they are not fully bitten by the side feeder screw, and the supply amount from the side feeder to the extruder becomes inconstant.

The dispersion index is determined from a particle size distribution as measured by a laser diffractometry particle size analyzer, and specifically defined by the equation:

dispersion index=($D90-D10$)/($D90+D10$)

wherein D10 and D90 are particle sizes at cumulative 10 vol % and 90 vol % in the particle size distribution, respectively.

Also preferably, the spherical phosphor has an average particle size of 5 to 50 µm, more preferably 10 to 30 µm. If the average particle size is less than 5 µm, it may be difficult to produce phosphor particles with a satisfactory function in an industrially acceptable manner. If the average particle size exceeds 50 µm, the adjustment of transmitted blue light by a light scattering agent may become insufficient.

The content of the spherical phosphor in the phosphor-containing resin molded part (wavelength conversion member) of the invention is 0.1 to 20% by weight, preferably 1 to 10% by weight, although it varies with the desired spectrum and chromaticity of the final emission from the phosphor-containing resin molded part. If the content is less than 0.1 wt %, the emission from the spherical phosphor is insufficient. If the content exceeds 20 wt %, the efficiency of light extraction from the phosphor-containing resin molded part (wavelength conversion member) is insufficient.

The resin used in the phosphor-containing resin molded part (wavelength conversion member) of the invention may be a light-transmissive thermoplastic resin or thermosetting resin, preferably thermoplastic resin. Examples of the light-transmissive thermoplastic resin used herein include polypropylene resins, polystyrene resins, polyethylene terephthalate resins, polybutylene terephthalate resins, polyester resins, polyvinyl chloride resins, ABS resins, and polycarbonate resins. Examples of the light-transmissive thermosetting resin include melamine resins, phenolic resins, and silicone resins. One or more of the foregoing resins may be used.

Also the phosphor-containing resin molded part (wavelength conversion member) of the invention preferably contains 0.01 to 10% by weight of a light scattering agent. The light scattering agent is added for improving the light diffusion of the phosphor-containing resin molded part. It is typically spherical silica having a high optical clarity and a low loss of transmitted light, but not limited thereto. A light scattering agent content of less than 0.01 wt % may lead to an insufficient light diffusing effect whereas a content in excess of 10 wt % may reduce the light transmittance of the phosphor-containing resin molded part.

The kneader (kneader/extruder) used in the preparation of the phosphor-containing resin molded part (wavelength conversion member) of the invention is not particularly limited, and exemplary kneaders include Banbury mixers, kneaders, roll mills, feeder-ruders, single-screw extruders, and twin-screw extruders. Phosphor particles may be fed to a single or twin-screw extruder by the technique of feeding the powder to the extruder midway via a side feeder or other techniques, for example, by feeding the thermoplastic or thermosetting resin composition as resin matrix through a first feed port and feeding the powder containing spherical phosphor and light scattering agent through a second feed port from a side feeder.

The thermoplastic resin may be obtained in pellet form, for example, by using a twin-screw extruder, extruding the resin through a die, cooling strands in a water bath, and cutting them by a pelletizer.

In this way, there are obtained resin pellets for phosphor-containing resin molded parts, comprising the thermoplastic resin having dispersed therein 0.1 to 20% by weight of the spherical phosphor of at least one type having an average roundness of up to 0.3.

Next, the thermoplastic or thermosetting resin composition as kneaded or the resin pellets are heat molded on an injection molding machine or extrusion molding machine into any desired shape for a particular application, like general purpose plastic materials. In this way, the phosphor-containing resin molded part (wavelength conversion member) of the invention is obtained.

The thickness of the phosphor-containing resin molded part (wavelength conversion member) is determined from the relationship to the content of spherical phosphor and in accordance with the desired wavelength conversion capacity (e.g., the quantity of light of different color emitted upon absorption of blue light relative to the quantity of incident blue light, and the transmittance of blue light), and is preferably 0.1 to 5 mm, for example. A part of thinner than 0.1 mm may be difficult to mold whereas a thickness in excess of 5 mm may cause an optical loss.

As described above, the phosphor-containing resin molded part (wavelength conversion member) of the invention is characterized by the minimized introduction of metal impurities, the uniform dispersion of spherical phosphor particles, the increased quantity of excitation light (blue light) extracted, and the easily adjustable ratio of excitation light to wavelength converted light. Specifically, the ratio of excitation light to wavelength converted light and even the quantity of light output can be adjusted by controlling the amount of the spherical phosphor in the phosphor-containing resin molded part (wavelength conversion member) and the amount of the light scattering agent if any.

Since the phosphor-containing resin molded part (wavelength conversion member) and resin pellets therefor according to the invention are such that the introduction of metal impurities during the preparation of the phosphor-containing resin molded part and resin pellets therefor is minimized due to the use of spherical phosphor particles, the content of impurity Fe in the phosphor-containing resin molded part and resin pellets therefor may be reduced to 10 ppm or less. This suppresses visually perceivable detrimental effects by the introduction of metal impurities and the coloration caused by metal impurities on heating during the molding step. In addition, the efficiency of light extraction from the phosphor relative to incident blue light is increased.

The wavelength conversion member of the invention may be disposed at the outermost portion of the light-emitting device although a clear cover, light scattering resinous cover or the like may be attached outside the member. When a wavelength conversion member is disposed at the outermost portion of the light-emitting device, the wavelength conversion member of the invention featuring minimized introduction of metal impurities is advantageous because brightness, sharpness and non-obscureness are desirable.

In particular, the wavelength conversion member of the invention offers brighter and sharper light emission. For example, when a spherical phosphor of formula (1) wherein A is at least one rare earth element selected from Y and Gd is used as the spherical phosphor, the wavelength conversion member may have a L* value of at least 60, especially at least 75, a b* value of at least 50, especially at least 70, and a saturation C* of at least 50, especially at least 70, as expressed according to the CIE L*a*b* colorimetric system. When a spherical phosphor of formula (1) wherein A is Lu is used as the spherical phosphor, the wavelength conversion member may have a L* value of at least 60, a b* value of at least 30, and a saturation C* of at least 40, as expressed according to the CIE L*a*b* colorimetric system.

It is noted that the CIE L*a*b* colorimetric system includes indexes of luminosity, hue and saturation of an object as prescribed by the Commission Internationale de l'Eclairage (CIE) in 1976 and also prescribed in JIS Z 8729. Saturation C* is computed as $\{(a^*)^2+(b^*)^2\}^{1/2}$.

Next, the light-emitting device of the invention is described.

FIG. 1 is a schematic cross-sectional view showing one embodiment (1) of a light-emitting device according to the invention.

The light-emitting device of the invention is depicted at 10 in FIG. 1 as comprising a blue LED light source 11 and an inventive wavelength conversion member 12 disposed on an optical axis of the light source 11.

The blue LED light source 11 may emit light containing a component capable of exciting spherical phosphor particles 12a in the wavelength conversion member 12, for example, blue light of emission wavelength about 420 to 490 nm, preferably about 440 to 470 nm. The blue LED light source 11 is composed of one or more LED chips.

The wavelength conversion member 12 is a phosphor-containing resin molded part comprising a thermoplastic resin 12b and spherical phosphor particles 12a of at least one type represented by the compositional formula (1) and having an average roundness of up to 0.3, dispersed therein in an amount of 0.1 to 20% by weight, as mentioned above.

The light-emitting device 10 operates such that once the blue LED light source 11 emits excitation light Lr which enters the wavelength conversion member 12, a portion of the excitation light Lr is absorbed by the spherical phosphor 12a and converted to wavelength-converted light Lk of the predetermined wavelength region (for example, yellow light), which exits the wavelength conversion member 12. Most of the remainder of the excitation light Lr passes between spherical phosphor particles 12a, penetrates through the thermoplastic resin 12b, and exits the wavelength conversion member 12. Since phosphor particles 12a are spherical, the excitation light Lr incident on the spherical phosphor 12a is efficiently absorbed and converted to wavelength-converted light Lk thereby. Even when the excitation light Lr or the wavelength-converted light Lk is reflected by the spherical phosphor 12a, little is reflected back to the blue LED light source 11 side, and most is reflected in the light delivery direction (outward in the optical axis direction) of the light-emitting device 10. Accordingly, the quantity of light output suffers a minimal loss, and the ratio of the quantity of excitation light to the quantity of wavelength-converted light is readily adjustable.

In the light-emitting device 10 of FIG. 1, a diffuse lens is preferably disposed outside a luminous body of emitting pseudo-white light, specifically outside the wavelength conversion member 12 because light uniformity is enhanced.

FIG. 2 is a schematic cross-sectional view showing another embodiment (2) of a light-emitting device according to the invention.

The light-emitting device of the invention is depicted at 20 in FIG. 2 as comprising a blue LED light source 11, an inventive wavelength conversion member 12 as defined above, and another wavelength conversion member 13 comprising a phosphor capable of absorbing blue light and emitting light having a different wavelength than the spherical phosphor 12a. Preferably the inventive wavelength conversion member 12 and the other wavelength conversion member 13 form a layer structure as shown in FIG. 2.

In this embodiment, the blued LED light source 11 and wavelength conversion member 12 are the same as in FIG. 1.

The other wavelength conversion member 13 preferably comprises a red phosphor capable of absorbing blue light and emitting at least red light, and for example, a resin molding of a thermoplastic or thermosetting resin having a preselected complex fluoride phosphor dispersed therein. Examples of the thermoplastic and thermosetting resins are as exemplified above.

The complex fluoride phosphor used herein is preferably a red phosphor having the formula (2):

$$D_2(M_{1-w}Mn_w)F_6 \qquad (2)$$

wherein M is one or two or more of tetravalent elements selected from Si, Ti, Zr, Hf, Ge, and Sn, D is one or two or more of alkali metals selected from Li, Na, K, Rb, and Cs and containing at least Na and/or K, and w is a number of 0.001 to 0.3, preferably 0.001 to 0.1.

In a layer structure consisting of a first wavelength conversion member comprising a phosphor and a second wavelength conversion member comprising a phosphor capable of producing a different emission spectrum than the phosphor in the first wavelength conversion member upon excitation by blue light, a certain quantity of blue light must be available to the second wavelength conversion member so that the light output of the light emitting device may have the desired chromaticity. If the phosphor in the first wavelength conversion member is a conventional phosphor having an average roundness of more than 0.3, the excitation light, after entry into the first wavelength conversion member, is repeatedly reflected and scattered within the first wavelength conversion member, failing to take out a quantity of excitation light necessary for the second wavelength conversion member. In addition, since the conventional irregular phosphor has a lower quantum efficiency than the spherical phosphor used herein, no sufficient light flux is available for wavelength conversion.

In contrast, the light-emitting device 20 using the inventive wavelength conversion member 12 as the first wavelength conversion member is successful in taking a sufficient quantity of excitation light Lr out of the wavelength conversion member 12 to the side of the wavelength conversion member 13 as the second wavelength conversion member. Thus excitation light Lr (blue light), wavelength-converted light Lk (e.g., yellow light) from the wavelength conversion member 12, and wavelength-converted light (e.g., red light) from the wavelength conversion member 13 are available in the predetermined proportion, resulting in the light-emitting device 20 producing a light output with the desired chromaticity, typically pseudo-white light with warmth.

In the light-emitting device 20 of FIG. 2, a diffuse lens is preferably disposed outside a luminous body of emitting pseudo-white light, specifically outside the wavelength conversion member 13 because light uniformity is enhanced.

The phosphor-containing resin molded part of the invention is suited as a wavelength conversion member in a light-emitting device of remote phosphor technology wherein a wavelength conversion member is spaced apart from a blue LED light source by a gas or vacuum layer. Because of its light distribution characteristics distinguishable from general LED light-emitting devices, such as surface emission and a wide radiation angle, the remote phosphor system is best suited as illuminators for providing illumination over a wide area.

EXAMPLES

Examples and Comparative Examples are given below for illustrating the invention, but the invention is not limited thereto.

Example 1

A 99.9% purity yttrium oxide ($Y_2O_3$) powder having an average particle size of 0.3 μm, a 99.9% purity aluminum oxide ($Al_2O_3$) powder having an average particle size of 0.5 μm and a 99.9% purity cerium oxide ($CeO_2$) powder having an average particle size of 0.2 μm were mixed so as to provide a composition $(Y_{0.911}Ce_{0.019}Al_{0.070})_3Al_5O_{12}$. The powder mixture, 1,000 g, was combined with 1,500 g of deionized water, 10 g of poly(ammonium acrylate), and 2 g of carboxymethyl cellulose and milled in a ball mill for 10 hours. The resulting slurry was granulated through a two-fluid nozzle, obtaining granules having an average particle size of 24.3 μm. The granules were heat treated in air at 1,400° C. for 2 hours to burn off the organic matter. The fired granules were passed through an argon plasma for melting, whereupon the melt was quenched into spherical particles. The spherical particles were heat treated in argon gas containing 1 vol % of hydrogen at 1,350° C. for 6 hours, yielding phosphor particles having a particle size D50 of 18.0 μm, a dispersion index of 0.28, and a roundness of 0.10.

Next, an aromatic polycarbonate resin was fed into a twin-screw extruder through a first feed port, and the spherical yellow phosphor of composition $(Y_{0.911}Ce_{0.019}Al_{0.070})_3Al_5O_{12}$ obtained above was fed through a second feed port by a side-feeder, so that the content of spherical yellow phosphor in the resin might be 5% by weight. The resin was extruded at a cylinder temperature of 280° C., a screw rotational speed of 100 rpm, and a discharge rate of 6 kg/hr, whereupon the extruded strands were cooled in a water bath and cut into pellets by means of a pelletizer. The pellets were dried at 120° C. for 5 hours, after which they were molded into a specimen (wavelength conversion member) of 2 mm thick by an injection molding machine. While the specimen thus obtained was colored solely with the phosphor, it did not look obscure due to incidental introduction of metal fines abraded from the extruder screw and side-feeder screw (visual observation).

With the specimen placed above a blue LED having an emission peak wavelength of 455 nm, an emission intensity and average color rendering index Ra were measured by means of an illuminance spectrophotometer CL-500A (Konica-Minolta Optics Co., Ltd.), a ratio of excitation light transmitted being computed from the emission intensity. The results of measurement are shown in Table 1. FIG. 3 is a SEM image of a cross section of the wavelength conversion member prepared in Example 1. Spherical phosphor particles used in this example were observed.

Portions of the pellets and the injection molded specimen were fired in air at 1,000° C. for burning off the resin. The ash was boiled in hydrochloric acid for extracting Fe. On quantitative analysis by the ICP spectrometry, 5.1 ppm of Fe was detected in the pellets and 5.5 ppm of Fe detected in the specimen.

The specimen was analyzed for the CIE L*a*b* colorimetric system using a colorimeter CR-200 (Konica-Minolta Optics Co., Ltd.) and standard light D65. The results are L*=72.46, b*=64.51, and C*=65.65.

Comparative Example 1

A 99.9% purity yttrium oxide ($Y_2O_3$) powder having an average particle size of 1.0 μm, a 99.9% purity aluminum oxide ($Al_2O_3$) powder having an average particle size of 3.0 μm and a 99.9% purity cerium oxide ($CeO_2$) powder having an average particle size of 0.2 μm were mixed so as to provide a composition $Y_{2.94}Ce_{0.06}Al_5O_{12}$. To 1,000 g of the powder mixture was added 200 g of barium fluoride as flux, followed by thorough mixing. The powder mixture was placed in an alumina crucible and heat treated in argon gas at 1,390° C. for 10 hours. The fired powder was washed with water, separated and dried, yielding phosphor particles.

Next, an aromatic polycarbonate resin was fed into a twin-screw extruder through a first feed port, and the above-obtained yellow phosphor of composition $Y_{2.94}Ce_{0.06}Al_5O_{12}$ having a particle size D50 of 7.43 μm, a dispersion index of 0.77, and a roundness of 0.52 was fed through a second feed port by a side-feeder, so that the content of yellow phosphor in the resin might be 5% by weight. The resin was extruded at a cylinder temperature of 280° C., a screw rotational speed of 100 rpm, and a discharge rate of 6 kg/hr, whereupon the extruded strands were cooled in a water bath and cut into pellets by means of a pelletizer. The pellets were dried at 120° C. for 5 hours, after which they were molded into a specimen (wavelength conversion member) of 2 mm thick by an injection molding machine. The specimen thus obtained looked obscure due to introduction of metal fines abraded from the extruder screw and side-feeder screw (visual observation).

Figure 4:
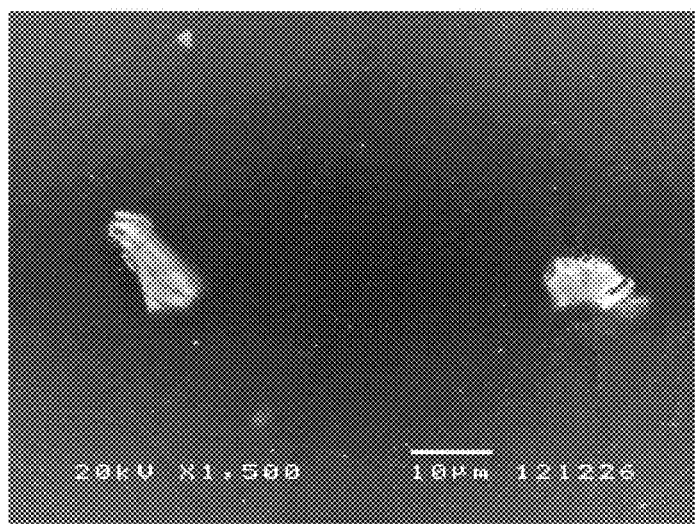
FIG. 4 is a SEM image showing a cross section of the wavelength conversion member in Comparative Example 1.

The specimen was analyzed as in Example 1. The results of measurement are shown in Table 1. FIG. 4 is a SEM image of a cross section of the wavelength conversion member prepared. Irregular phosphor particles used in the Comparative Example were observed.

The pellets and the injection molded specimen were quantitatively determined for Fe as in Example 1, detecting 17 ppm of Fe in the pellets and 18 ppm of Fe in the specimen.

The specimen was analyzed for the CIE L*a*b* colorimetric system as in Example 1, finding L*=58.09, b*=41.58, and C*=41.78.

Since phosphor particles in Comparative Example 1 are of irregular shape, they tend to abrade the extruder screw and side-feeder screw, and coloring by abraded metal was found.

Examples 2 to 4

An aromatic polycarbonate resin was fed into a twin-screw extruder through a first feed port, and the spherical yellow phosphor of Example 1 and spherical silica as light scattering agent were fed through a second feed port by a side-feeder, so as to give the composition of Table 2. The resin was extruded at a cylinder temperature of 280° C., a screw rotational speed of 100 rpm, and a discharge rate of 6 kg/hr, whereupon the extruded strands were cooled in a water bath and cut into pellets by means of a pelletizer. The pellets were dried at 120° C. for 5 hours, after which they were molded into a specimen (wavelength conversion member) of 2 mm thick by an injection molding machine. While the specimen thus obtained was colored solely with the

TABLE 1

| | Phosphor composition | Addition amount (wt %) | Coloring (obscure) of specimen | Ratio of excitation light transmitted *1 | Average color rendering index Ra |
|---|---|---|---|---|---|
| Example 1 | $(Y_{0.911}Ce_{0.019}Al_{0.070})_3Al_5O_{12}$ | 5 | no | 100 | 83 |
| Comparative Example 1 | $Y_{2.94}Ce_{0.06}Al_5O_{12}$ | 5 | found | 77 | 77 |

*1 relative value provided that the intensity of excitation light (wavelength 455 nm) transmitted in Example 1 is 100

Figure 5:
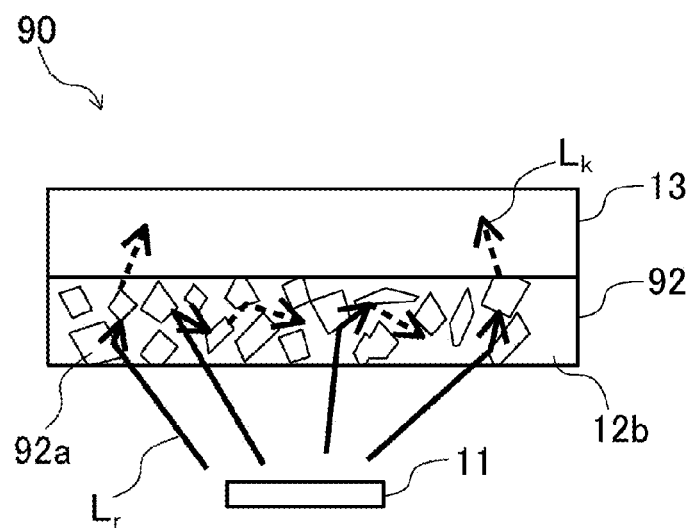
FIG. 5 is a schematic cross-sectional view showing the construction of the light-emitting device in Comparative Example 1.

The wavelength conversion member of Example 1 showed a higher ratio of excitation light transmitted (intensity of transmitted blue light) than Comparative Example 1. The wavelength conversion member of Example 1 showed a higher average color rendering index Ra than Comparative Example 1 because yellow light emitted by absorption of and excitation by blue component was fully taken out. In contrast, the wavelength conversion member of Comparative Example 1, in which substantial reflection of excitation light occurs within the resin because the phosphor dispersed in the resin is of irregular shape (average roundness in excess of 0.3), showed a lower ratio of excitation light transmitted (intensity of transmitted blue light) than Example 1. While the low ratio of excitation light transmitted suggests that within the wavelength conversion member, a corresponding proportion of light is absorbed by the phosphor for emission or absorbed via repeated reflection and scattering within the resin layer (indicating an optical loss), it is concluded that an optical loss occurs as shown in FIG. 5 because Comparative Example 1 has a lower average color rendering index Ra than Example 1. FIG. 5 is a schematic cross-sectional view of components of the light-emitting device. There are illustrated a light-emitting device 90, a wavelength conversion member 92, and a conventional phosphor 92a while other components in FIG. 5 are designated by the same reference numerals as in FIG. 1, with their description omitted.

phosphor, it did not look obscure due to introduction of metal fines abraded from the extruder screw and side-feeder screw (visual observation).

With the specimen placed above a blue LED having an emission peak wavelength of 455 nm, an emission intensity was measured by means of an illuminance spectrophotometer CL-500A (Konica-Minolta Optics Co., Ltd.), a ratio of excitation light transmitted being computed from the emission intensity.

Further, a structure was constructed by placing a thermoplastic resin molded part containing $K_2SiF_6$:Mn red phosphor having an emission peak around 630 nm upon excitation by blue light of 400-500 nm as a second wavelength conversion member, on the wavelength conversion member (spherical yellow phosphor-containing thermoplastic resin molded part) of Example 2, 3 or 4. The structure was measured for average color rendering index Ra by means of an illuminance spectrophotometer CL-500A (Konica-Minolta Optics Co., Ltd.). The results of measurement are shown in Table 2.

The pellets and the injection molded specimen were quantitatively determined for Fe as in Example 1, detecting 4.9 ppm of Fe in the pellets and 4.9 ppm of Fe in the specimen of Example 2; 5.5 ppm of Fe in the pellets and 5.7 ppm of Fe in the specimen of Example 3; and 5.6 ppm of Fe in the pellets and 5.9 ppm of Fe in the specimen of Example 4.

TABLE 2

| | Phosphor | | Light scattering agent (wt %) | Coloring (obscure) of specimen | Ratio of excitation light transmitted *2 | Average color rendering index Ra *3 |
|---|---|---|---|---|---|---|
| | Composition | Addition amount (wt %) *1 | | | | |
| Example 2 | $(Y_{0.911}Ce_{0.019}Al_{0.070})_3Al_5O_{12}$ | 3 | 0 | no | 100 | 79 |
| Example 3 | $(Y_{0.911}Ce_{0.019}Al_{0.070})_3Al_5O_{12}$ | 3 | 0.5 | no | 87 | 90 |
| Example 4 | $(Y_{0.911}Ce_{0.019}Al_{0.070})_3Al_5O_{12}$ | 3 | 1.0 | no | 66 | 83 |

Figure 6:
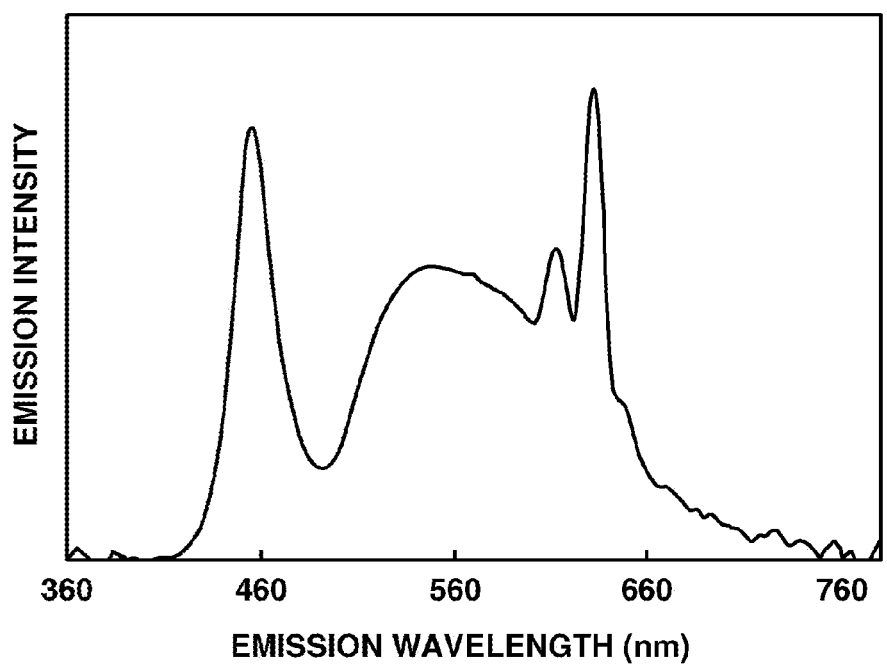
FIG. 6 is a diagram showing the emission spectrum of the light-emitting device in Example 3.

*1 phosphor content in phosphor-containing resin
*2 relative value provided that the intensity of excitation light (wavelength 455 nm) transmitted in Example 2 is 100
*3 Average color rendering index Ra of the layer structure of first and second wavelength conversion members As seen from the results of Examples 2 to 4, when spherical yellow phosphor particles are dispersed, coloring due to metal fines abraded from the extruder screw and side-feeder screw is not observed. By controlling the amount of the light scattering agent blended, the ratio of excitation light transmitted (or the quantity of blue light transmitted) can be adjusted. Possible adjustment of the ratio of excitation light transmitted by means of the first wavelength conversion member (spherical yellow phosphor-containing thermoplastic resin molded part) is effective for adjusting the quantity of excitation light incident on the second wavelength conversion member and eventually the average color rendering index Ra of light output of the light-emitting device. When the light-emitting device is used as a light source for illumination, an emission spectrum with improved color rendering is obtainable. FIG. 6 shows an emission spectrum of Example 3.

Example 5

A 99.9% purity lutetium oxide ($Lu_2O_3$) powder having an average particle size of 0.3 μm, a 99.9% purity aluminum oxide ($Al_2O_3$) powder having an average particle size of 0.5 μm and a 99.9% purity cerium oxide ($CeO_2$) powder having an average particle size of 0.2 μm were mixed so as to provide a composition $(Lu_{0.902}Ce_{0.018}Al_{0.080})_3Al_5O_{12}$. The powder mixture, 1,000 g, was combined with 1,500 g of deionized water, 10 g of poly(ammonium acrylate), and 2 g of carboxymethyl cellulose and milled in a ball mill for 10 hours. The resulting slurry was granulated through a two-fluid nozzle, obtaining granules having an average particle size of 23.9 μm. The granules were heat treated in air at 1,380° C. for 2 hours to burn off the organic matter. The fired granules were passed through an argon plasma for melting, whereupon the melt was quenched into spherical particles. The spherical particles were heat treated in argon gas containing 1 vol % of hydrogen at 1,390° C. for 6 hours, yielding phosphor particles having a particle size D50 of 14.8 μm, a dispersion index of 0.28, and a roundness of 0.15.

Next, an aromatic polycarbonate resin was fed into a twin-screw extruder through a first feed port, and the spherical green phosphor of composition $(Lu_{0.902}Ce_{0.018}Al_{0.080})_3Al_5O_{12}$ obtained above was fed through a second feed port by a side-feeder, so that the content of spherical green phosphor in the resin might be 5% by weight. The resin was extruded at a cylinder temperature of 280° C., a screw rotational speed of 100 rpm, and a discharge rate of 6 kg/hr, whereupon the extruded strands were cooled in a water bath and cut into pellets by means of a pelletizer. The pellets were dried at 120° C. for 5 hours, after which they were molded into a specimen (wavelength conversion member) of 2 mm thick by an injection molding machine. While the specimen thus obtained was colored solely with the phosphor, it did not look obscure due to introduction of metal fines abraded from the extruder screw and side-feeder screw (visual observation).

With the specimen placed above a blue LED having an emission peak wavelength of 455 nm, an emission intensity and average color rendering index Ra were measured by means of an illuminance spectrophotometer CL-500A (Konica-Minolta Optics Co., Ltd.), a ratio of excitation light transmitted being computed from the emission intensity. The results of measurement are shown in Table 3.

The pellets and the injection molded specimen were quantitatively determined for Fe as in Example 1, detecting 4.5 ppm of Fe in the pellets and 4.8 ppm of Fe in the specimen.

The specimen was analyzed for the CIE L*a*b* colorimetric system as in Example 1, finding L*=70.28, b*=41.84, and C*=44.81.

Comparative Example 2

A 99.9% purity lutetium oxide ($Lu_2O_3$) powder having an average particle size of 1.0 μm, a 99.9% purity aluminum oxide ($Al_2O_3$) powder having an average particle size of 3.0 μm and a 99.9% purity cerium oxide ($CeO_2$) powder having an average particle size of 0.2 μm were mixed so as to provide a composition $Lu_{2.94}Ce_{0.06}Al_5O_{12}$. To 1,000 g of the powder mixture was added 200 g of barium fluoride as flux, followed by thorough mixing. The powder mixture was placed in an alumina crucible and heat treated in argon gas at 1,390° C. for 10 hours. The fired powder was washed with water, separated and dried, yielding phosphor particles.

Next, an aromatic polycarbonate resin was fed into a twin-screw extruder through a first feed port, and the above-obtained green phosphor of composition $Lu_{2.94}Ce_{0.06}Al_5O_{12}$ having a particle size D50 of 7.41 μm, a dispersion index of 0.81, and a roundness of 0.57 was fed through a second feed port by a side-feeder, so that the content of green phosphor in the resin might be 5% by weight. The resin was extruded at a cylinder temperature of 280° C., a screw rotational speed of 100 rpm, and a discharge rate of 6 kg/hr, whereupon the extruded strands were cooled in a water bath and cut into pellets by means of a pelletizer. The pellets were dried at 120° C. for 5 hours, after which they were molded into a specimen (wavelength conversion member) of 2 mm thick by an injection molding machine. The specimen thus obtained looked obscure due to introduction of metal fines abraded from the extruder screw and side-feeder screw (visual observation).

The specimen was analyzed as in Example 1. The results of measurement are shown in Table 3.

The pellets and the injection molded specimen were quantitatively determined for Fe as in Example 1, detecting 14 ppm of Fe in the pellets and 17 ppm of Fe in the specimen.

The specimen was analyzed for the CIE L*a*b* colorimetric system as in Example 1, finding L*=55.46, b*=25.54, and C*=37.23.

TABLE 3

| | Phosphor composition | Addition amount (wt %) | Coloring (obscure) of specimen | Ratio of excitation light transmitted *1 | Average color rendering index Ra |
|---|---|---|---|---|---|
| Example 5 | $(Lu_{0.902}Ce_{0.018}Al_{0.080})_3Al_5O_{12}$ | 5 | no | 100 | 72 |
| Comparative Example 2 | $Lu_{2.94}Ce_{0.06}Al_5O_{12}$ | 5 | found | 72 | 61 |

*1 relative value provided that the intensity of excitation light (wavelength 455 nm) transmitted in Example 5 is 100

Example 6

A polypropylene resin was fed into a twin-screw extruder through a first feed port, and the spherical yellow phosphor as in Example 1 was fed through a second feed port by a side-feeder, so that the content of spherical yellow phosphor in the resin might be 10% by weight. The resin was extruded at a cylinder temperature of 190° C., a screw rotational speed of 100 rpm, and a discharge rate of 6 kg/hr, whereupon the extruded strands were cooled in a water bath and cut into pellets by means of a pelletizer. The pellets were dried at 100° C. for 5 hours, after which they were molded into a specimen (wavelength conversion member) of 2 mm thick by an injection molding machine. While the specimen thus obtained was colored solely with the phosphor, it did not look obscure due to introduction of metal fines abraded from the extruder screw and side-feeder screw (visual observation).

The pellets and the injection molded specimen were quantitatively determined for Fe as in Example 1, detecting 2.5 ppm of Fe in the pellets and 2.8 ppm of Fe in the specimen.

The specimen was analyzed for the CIE L*a*b* colorimetric system as in Example 1, finding L*=79.76, b*=76.94, and C*=76.90.

Example 7

A 99.9% purity yttrium oxide ($Y_2O_3$) powder having an average particle size of 0.3 μm, a 99.9% purity aluminum oxide ($Al_2O_3$) powder having an average particle size of 0.5 μm and a 99.9% purity cerium oxide ($CeO_2$) powder having an average particle size of 0.2 μm were mixed so as to provide a composition $(Y_{0.754}Ce_{0.057}Al_{0.189})_3Al_5O_{12}$. The powder mixture, 1,000 g, was combined with 1,500 g of deionized water, 10 g of poly(ammonium acrylate), and 2 g of carboxymethyl cellulose and milled in a ball mill for 10 hours. The resulting slurry was granulated through a two-fluid nozzle, obtaining granules having an average particle size of 22.5 μm. The granules were heat treated in air at 1,350° C. for 2 hours to burn off the organic matter. The fired granules were passed through an argon plasma for melting, whereupon the melt was quenched into spherical particles. The spherical particles were heat treated in argon gas containing 1 vol % of hydrogen at 1,340° C. for 6 hours, yielding phosphor particles having a particle size D50 of 17.0 μm, a dispersion index of 0.31, and a roundness of 0.13.

Next, a polymethyl methacrylate resin was fed into a twin-screw extruder through a first feed port, and the spherical yellow phosphor of composition $(Y_{0.754}Ce_{0.057}Al_{0.189})_3Al_5O_{12}$ obtained above was fed through a second feed port by a side-feeder, so that the content of spherical yellow phosphor in the resin might be 10% by weight. The resin was extruded at a cylinder temperature of 230° C., a screw rotational speed of 100 rpm, and a discharge rate of 6 kg/hr, whereupon the extruded strands were cooled in a water bath and cut into pellets by means of a pelletizer. The pellets were dried at 90° C. for 5 hours, after which they were molded into a specimen (wavelength conversion member) of 2 mm thick by an injection molding machine. While the specimen thus obtained was colored solely with the phosphor, it did not look obscure due to introduction of metal fines abraded from the extruder screw and side-feeder screw (visual observation).

The pellets and the injection molded specimen were quantitatively determined for Fe as in Example 1, detecting 8.3 ppm of Fe in the pellets and 8.6 ppm of Fe in the specimen. The specimen was analyzed for the CIE L*a*b* colorimetric system as in Example 1, finding L*=80.39, b*=92.15, and C*=92.40.

Although the invention has been described with reference to the embodiments illustrated in the drawing, the invention is not limited thereto, and other embodiments may occur to, or various additions, changes and deletions may be made by those skilled in the art. All such embodiments fall in the scope of the invention as long as the advantages and results of the invention are obtainable.

REFERENCE SIGNS LIST 10, 20, 90 light-emitting device
11 blue LED light source
12, 92 wavelength conversion member
12a spherical phosphor
12b thermoplastic resin
13 another wavelength conversion member
92a conventional phosphor
Lk wavelength-converted light
Lr excitation light

The invention claimed is:
1. A phosphor-containing resin molded part comprising a resin and a spherical phosphor of at least one type represented by the compositional formula (1):

$$(A_xB_yC_z)_3C_5O_{12} \qquad (1)$$

wherein A is at least one rare earth element selected from among Y, Gd and Lu, B is at least one rare earth element selected from among Ce, Nd and Tb, C is Al and/or Ga, and x, y and z are positive numbers satisfying $0.002 \leq y \leq 0.2$, $0 < z \leq 2/3$, and $x+y+z=1$, and having an average roundness of up to 0.3, the phosphor being dispersed in the resin in an amount of 0.1 to 20% by weight.

2. The molded part of claim 1 wherein the spherical phosphor has a dispersion index of 0.1 to 0.7.

3. The molded part of claim 1, further comprising 0.01 to 10% by weight of a light scattering agent.

4. The molded part of claim 1 wherein said resin is a thermoplastic resin.

5. The molded part of claim 1, having an Fe content of not more than 10 ppm.

6. A wavelength conversion member comprising the phosphor-containing resin molded part of claim 1.

7. The wavelength conversion member of claim 6 wherein in formula (1), A is at least one rare earth element selected from Y and Gd, and the wavelength conversion member has a L* value of at least 60, a b* value of at least 50, and a saturation C* of at least 50 as expressed according to the CIE L*a*b* colorimetric system.

8. The wavelength conversion member of claim 6 wherein in formula (1), A is Lu, and the wavelength conversion member has a L* value of at least 60, a b* value of at least 30, and a saturation C* of at least 40 as expressed according to the CIE L*a*b* colorimetric system.

9. A light-emitting device comprising a blue LED light source having an optical axis and a wavelength conversion member disposed on the optical axis, the wavelength conversion member being of claim 6.

10. The light-emitting device of claim 9, further comprising another wavelength conversion member comprising a phosphor capable of absorbing blue light and emitting light having a different wavelength than the spherical phosphor.

11. The light-emitting device of claim 10 wherein the other wavelength conversion member comprises a red phosphor capable of absorbing blue light and emitting at least red light.

12. The light-emitting device of claim 9, further comprising a diffuse lens disposed outside a luminous body of emitting pseudo-white light.

13. Resin pellets for forming phosphor-containing resin molded parts, comprising a thermoplastic resin and a spherical phosphor of at least one type represented by the compositional formula (1):

$$(A_xB_yC_z)_3C_5O_{12} \qquad (1)$$

wherein A is at least one rare earth element selected from among Y, Gd and Lu, B is at least one rare earth element selected from among Ce, Nd and Tb, C is Al and/or Ga, and x, y and z are positive numbers satisfying $0.002 \leq y \leq 0.2$, $0 < z \leq 2/3$, and $x+y+z=1$, and having an average roundness of up to 0.3, the phosphor being dispersed in the resin in an amount of 0.1 to 20% by weight.

14. The resin pellets of claim 13 wherein the spherical phosphor has a dispersion index of 0.1 to 0.7.

15. The resin pellets of claim 13, further comprising 0.01 to 10% by weight of a light scattering agent.

16. The resin pellets of claim 13, having an Fe content of not more than 10 ppm.

* * * * *